US008138775B2

(12) United States Patent
Tomblinson

(10) Patent No.: US 8,138,775 B2
(45) Date of Patent: Mar. 20, 2012

(54) CMOS-CONTROLLED PRINTHEAD SENSE CIRCUIT IN INKJET PRINTER

(75) Inventor: Ian David Tomblinson, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 549 days.

(21) Appl. No.: 12/330,586

(22) Filed: Dec. 9, 2008

(65) Prior Publication Data

US 2010/0141702 A1 Jun. 10, 2010

(51) Int. Cl.
*G01R 31/00* (2006.01)

(52) U.S. Cl. ................ 324/750.01; 324/762.09; 347/19; 327/209; 327/333

(58) Field of Classification Search ............. 324/750.01, 324/762.01, 762.09; 347/19; 327/209, 333
See application file for complete search history.

(56) References Cited

U.S. PATENT DOCUMENTS 7,227,400 B1 * 6/2007 Gillespie et al. .............. 327/333

* cited by examiner

*Primary Examiner* — Arleen M Vazquez

(57) ABSTRACT

A CMOS-controlled printhead sense circuit includes a CMOS control circuit module operable as a transmission gate switchable between first and second signal levels and a CMOS sense circuit module operable in a printhead sense mode in response to the CMOS control circuit module being switched to the first level and in a transparent mode in response to the control circuit module being switch to the second level. The CMOS control circuit module includes a combination of PMOS and NMOS FETs which define a CMOS switchable transmission gate. The CMOS sense circuit module includes a combination of PMOS and NMOS FETs which define respectively a switch device switchable between high and low states corresponding to the sense and transparent modes and a load enhancement device for the switch device.

5 Claims, 4 Drawing Sheets

CMOS-CONTROLLED PRINTHEAD SENSE CIRCUIT IN INKJET PRINTER

CROSS REFERENCES TO RELATED APPLICATIONS

None.

BACKGROUND

1. Field of the Invention

The present invention relates generally to an inkjet printer system and, more particularly, to a complementary metal-oxide-semiconductor (CMOS) controlled printhead sense circuit in an inkjet printer.

2. Description of the Related Art

A printhead power-up process in an inkjet printer must be performed to ensure the printhead is not damaged. A part of this process is first checking that a printhead is present in the printer and installed correctly. Previously, heater chips in the printer have used a simple PNP transistor, connected to function as a p-diode, as the printhead sense circuit to detect the presence of the printhead. An example of this prior art p-diode printhead sense circuit is illustrated in FIG. 1.

The p-diode printhead sense circuit was originally implemented to function primarily as an electrostatic discharge device (ESD) between logic pins and a logic power rail (LPWR). Its secondary function was as a printhead sense circuit. The inkjet printer could apply a voltage to the temperature sense resistor pin (TSR+) prior to printhead power (VPH) being applied and a current would be drawn from the temperature sense resistor pin to the logic power rail, the control node for the sense circuit. A voltage similar to the typical temperature sense resistor voltage would develop on the temperature sense resistor pin and the sense circuit would recognize that a printhead was present. Then, when the normal printhead operation occurred, the printhead power would increase which would drive the logic power rail control node on the chip high. This would turn the p-diode off and allow for normal temperature sense resistor reading to begin.

This prior art printhead sense circuit has shortcomings. Primarily, they concern the consequences of leakage of current on the input pin. Leakage of current of sufficient magnitude on the input pin can disturb temperature reading and introduce lack of control of the operation of the circuit. While more recent printhead sense circuitry is somewhat more reliable for keeping current leakage on the temperature sense node to a tolerable minimum, less than a micro-Amp, the value of the logic power rail still can droop during operation. So the circuitry presently in use is still in some jeopardy of affecting the temperature sense resistor circuitry.

Thus, the prior art printhead sense circuit still has two major shortcomings, the first being potentially an unacceptable magnitude of leakage current into the temperature sense pin, and the second being an unstable method of holding the printhead sense circuit off during normal printhead operation. As a consequence, there is still a need for an innovation that will overcome these shortcomings.

SUMMARY OF THE INVENTION

The present invention meets this need by constituting an innovation that provides a low current-leakage, controlled way to sense presence of a printhead in an inkjet printer. This innovation is referred to as a CMOS-controlled printhead sense circuit. Current leakage is limited to less than 1 nA into an input pin during normal heater chip operation. This facilitates introduction of future temperature sensing technology that needs low pin current leakage to sense temperatures at a 1° C. resolution for improved print quality. Precise temperature reading is important to future heater chips where temperature control as accurate as 1° C. may be necessary for competitive print quality. In addition, temperature sensing circuitry of the future will require the input pin to have much less leakage current for precise monitoring of on-chip temperatures. The CMOS-controlled printhead sense circuit retains the prior art p-diode sense circuit's function for printhead sensing and, at the same time, has input pin leakage less than 1 nA under normal printhead operation.

Accordingly, in an aspect of the present invention, a CMOS-controlled printhead sense circuit includes a control circuit module operable as a transmission gate switchable between first and second signal levels, and a sense circuit module operable in a printhead sense mode in response to the control circuit module being switched to the first level and in a transparent mode in response to the control circuit module being switch to the second level. The control circuit module includes a combination of PMOS and NMOS FETs which define a CMOS switchable transmission gate. The sense circuit module includes a combination of PMOS and NMOS FETs which respectively define a switch device switchable between high and low states corresponding to the sense and transparent modes and a load enhancement device for the switch device.

BRIEF DESCRIPTION OF THE DRAWINGS

Figure 1:
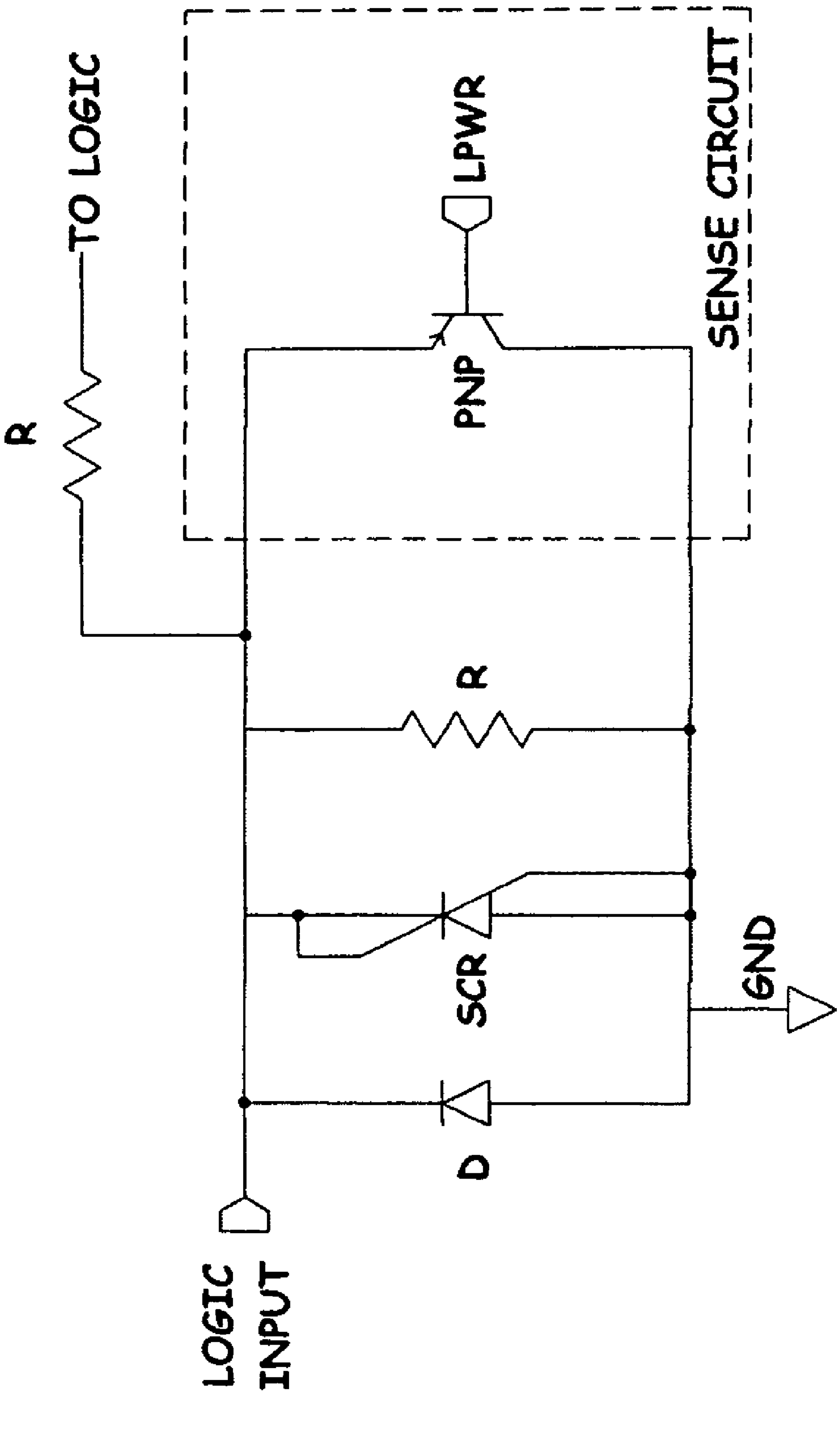

Having thus described the invention in general terms, reference will now be made to the accompanying drawings, which are not necessarily drawn to scale, and wherein:

FIG. 1 is a schematic diagram of a prior art p-diode printhead sense circuit.

Figure 2:
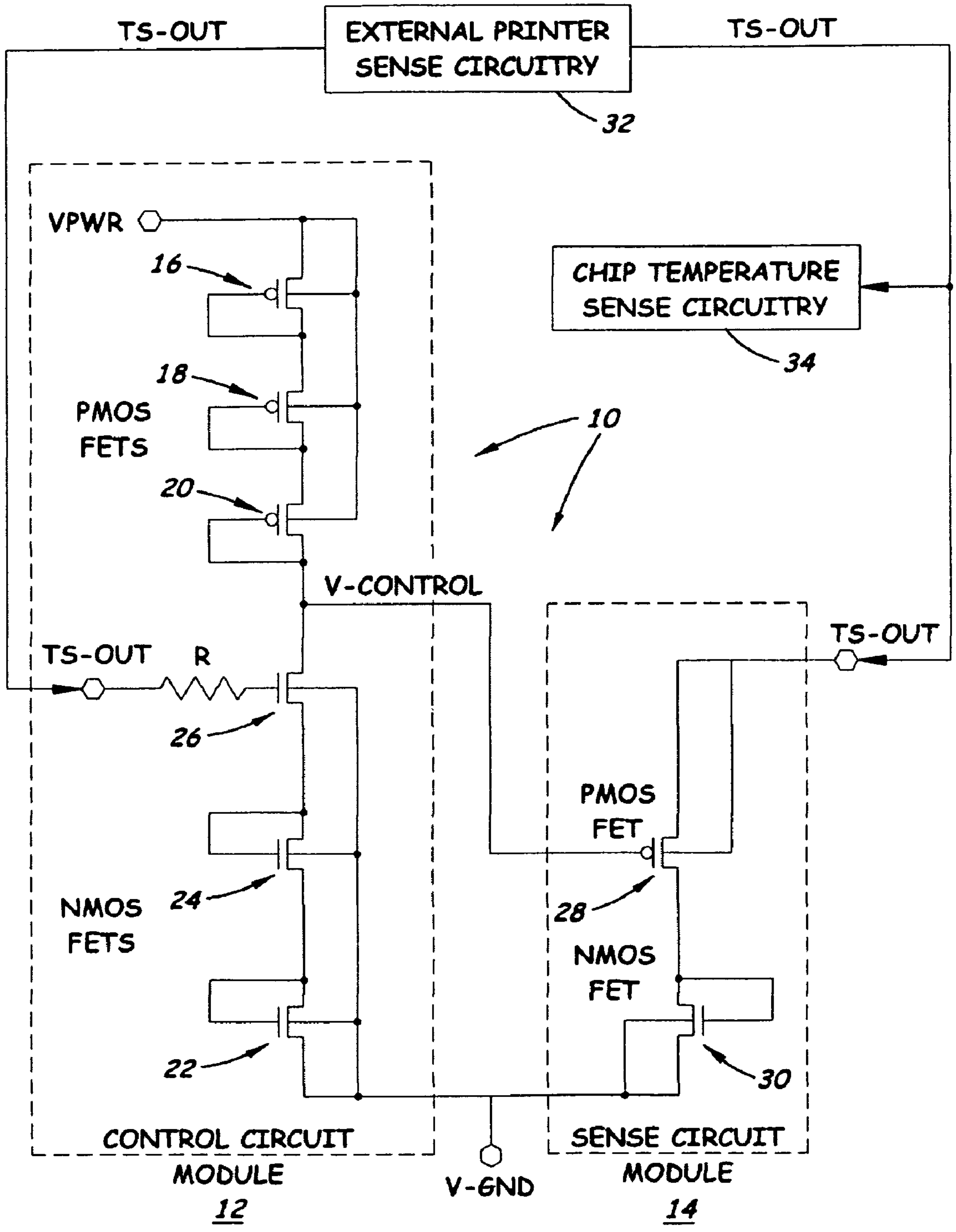

FIG. 2 is a schematic diagram of a CMOS-controlled printhead sense circuit according to the present invention.

Figure 3:
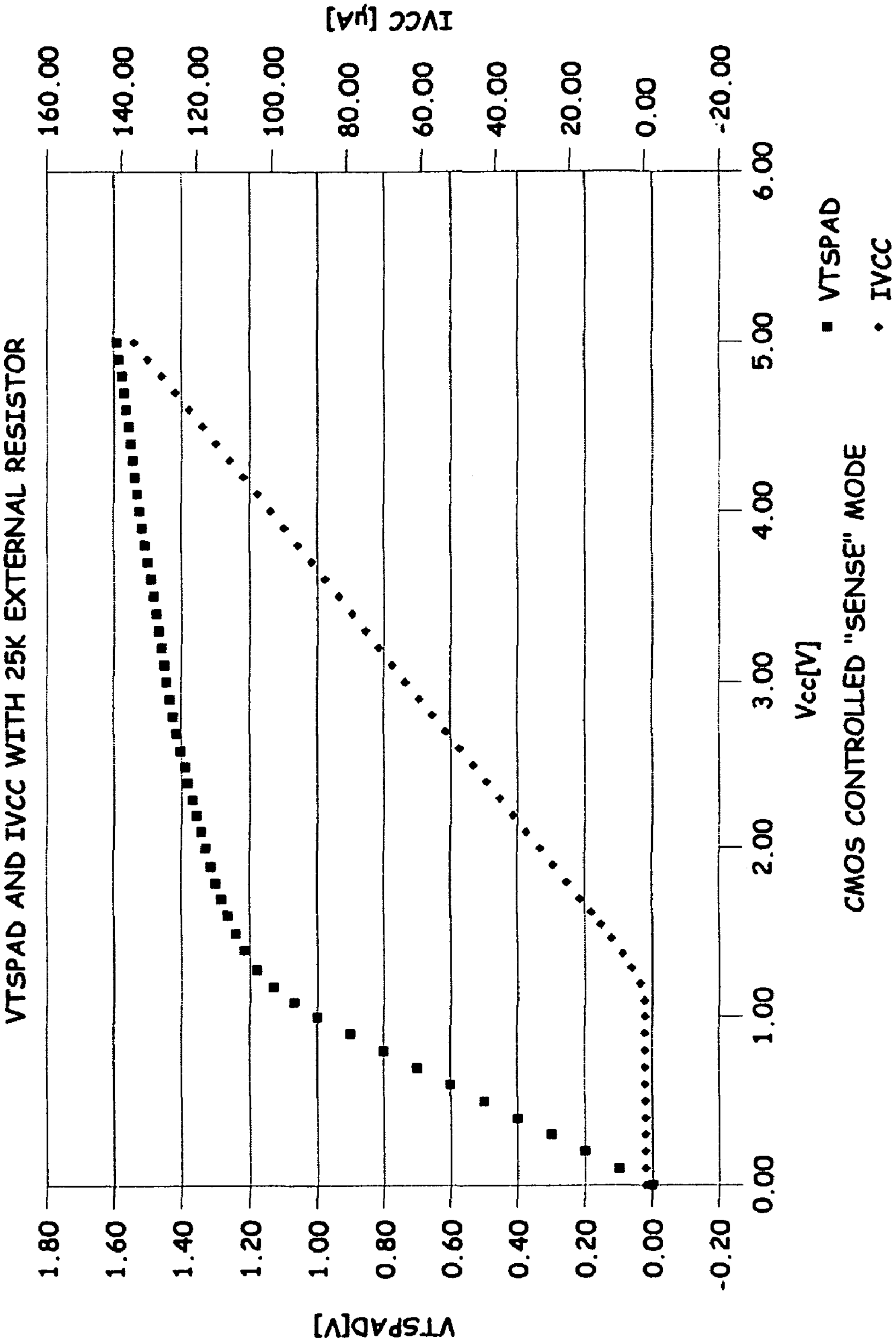

FIG. 3 is a graph of the relationship between certain characteristics of the circuit of FIG. 2 during a "sense" mode of operation.

Figure 4:
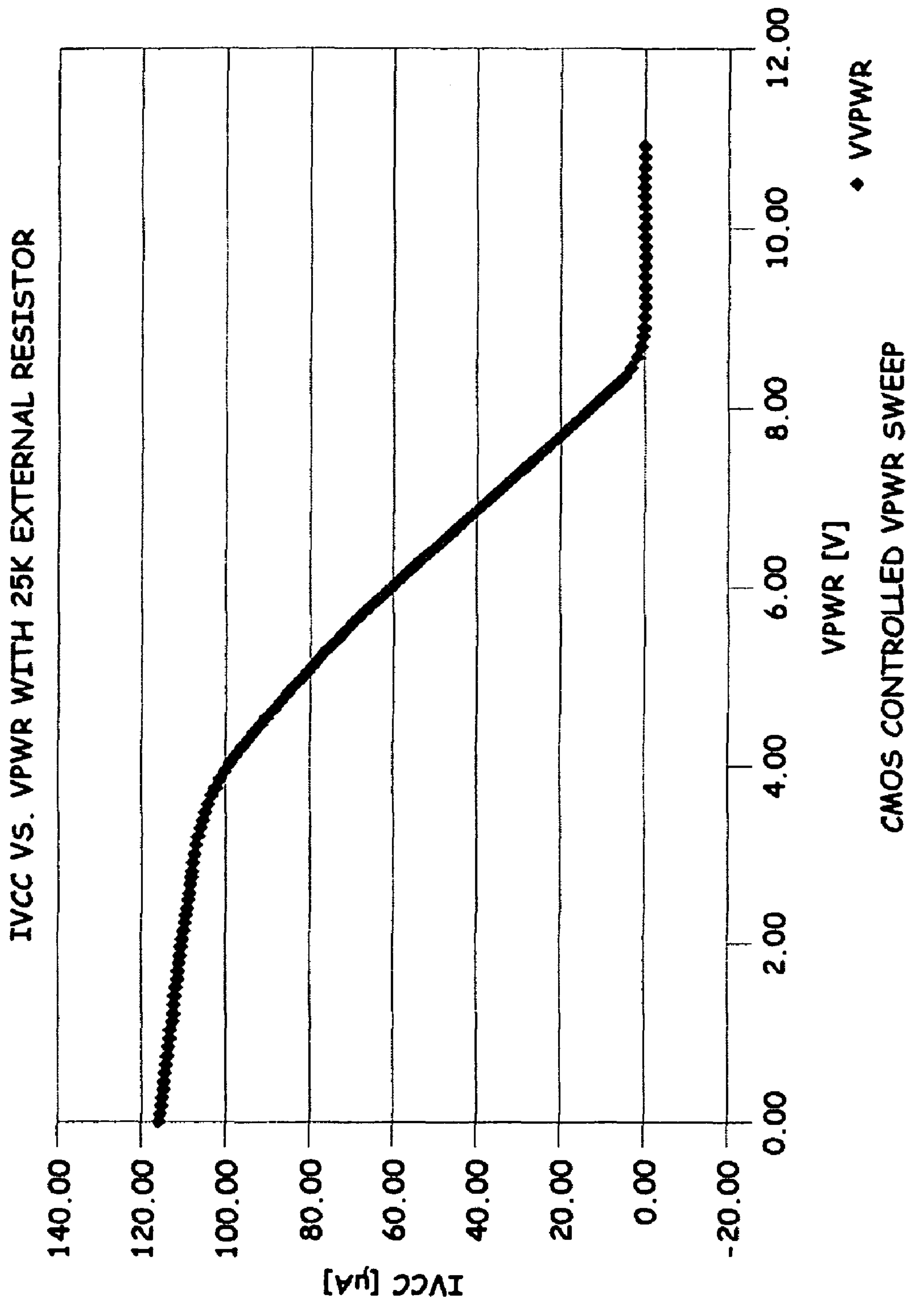

FIG. 4 is a graph of the relationship between certain characteristics of the circuit of FIG. 2 during a "transparent" mode of operation in which it does not load other sense circuits.

DETAILED DESCRIPTION

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numerals refer to like elements throughout the views.

Referring now to FIG. 2, there is illustrated a schematic diagram of an exemplary embodiment of a CMOS-controlled printhead sense circuit, generally designated 10, for an inkjet printer, according to the present invention. FIG. 2 also shows the connections of the circuit 10 with other sense circuits 32, 34 of the printer. The circuit 10 includes a control circuit module 12 and a sense circuit module 14.

The control circuit module 12 of the printhead sense circuit 10 includes a set of series enhancement mode PMOS FETs 16, 18, 20 connected to a set of N-MOS FETs 22, 24, 26. The two NMOS FETs 22, 24 are connected as enhancement mode devices while the third NMOS FET 26 is gate-controlled by the ts-out node. This control of the gate ensures the v-control node is pulled strongly to ground when the sense circuit module 14 is in use. In addition, a 1 kΩ resistor (R) provides ESD protection for this gate (FET 26).

In this arrangement, the control circuit module 12 of the printhead sense circuit 10 provides a CMOS device comprised of the combination of PMOS FETs 16-20 and NMOS FETs 22-26. When used in combination, the PMOS FETs 16-20 and NMOS FETs and 22-26 counteract their separate limitations if one or the other of them is utilized as a single device. As is known, both NMOS FETs and PMOS FETs individually exhibit poor performance when transmitting particular logic information: the NMOS FET degrades the logic level 1; the PMOS FET degrades the logic level 0. However, an effective pass gate is constructed from the combination of NMOS FETs and PMOS FETs working in a complementary way to provide the CMOS type of gate with the improved performance. In such an integrated circuit arrangement, the control circuit module 12 thus constitutes a CMOS transmission gate transformable between first and second signal levels.

The sense circuit module 14 of the printhead sense circuit 10 may include a PMOS FET 28 and NMOS FET 30, connected between the v-control node and the ts-out node, but connected in a different arrangement with respect to one another compared to the case of the same components in the control circuit module 12. The difference in the control circuit module 12 and the sense circuit module 14 is that module 12, as mentioned above, is a transmission gate while module 14 is a PMOS switch with a NMOS load. In this arrangement, the PMOS FET 28 of the sense circuit module 14 of the printhead sense circuit 10 provides a CMOS switch device that ultimately controls the "on/off" functionality of the entire circuit 10. The NMOS FET 30 is an enhancement load device that sets the current drawn from the ts-out node during circuit "on" operation. Thus, it is an NMOS load device, and does not primarily serve as part of the actual switching mechanism.

The first mode of operation for the CMOS-controlled printhead sense circuit 10 is the "sense" mode of operation. The "sense" mode is used when the printer needs to detect the presence of the printhead. Power is not provided to the printhead in this mode; therefore the VPWR node will be floating (or driven to 0v). The ts-out node will be driven with 5v across a 25 kΩ resistor contained within the external printer sense circuitry 32. Initially, the ts-out node will go to 5v and this will drive the NMOS FET stack 22-26 in the control circuit module 12 to remove any charge from the v-control node. With any stray charge removed from the v-control node the circuit 10 is now fully in "sense" mode. The PMOS FET 28 in the sense circuit module 14 will be driven into saturation and the enhancement NMOS 30 will allow the circuit 10 to conduct current. The result is a voltage divider between the external 25 kΩ resistor and the sense circuit module 14. This voltage (or the current drawn from the supply) can then be read by the external sense circuitry 32. If a printhead is not installed the external sense circuitry 32 will see 5v and no current draw at the ts-out node.

The V-I characteristics of the circuit 10, while in the "sense" mode, are represented by the graph of FIG. 3. When VCC=5v, the circuit 10 draws approximately 140 μA. This value is very similar to the prior art p-diode circuit (FIG. 1) and thus the CMOS-controlled circuit 10 retains the prior art circuit's functionality.

The second mode of operation of the CMOS-controlled printhead sense circuit 10 is the "transparent" mode of operation. In the "transparent" mode of operation, the circuit 10 should not affect any components of the heater chip or the printer. The "transparent" mode is selected by applying power to the printhead. When VPWR is driven to 11v, the PMOS FET stack 16-20 in the control circuit module 12 drives the v-control node high. This turns the sense circuit module 14 off completely by driving a negative v-sg on the PMOS FET 28 of the sense circuit module 14. At this point the input of the sense circuit module 14 at the source of the PMOS FET 28 is high impedance.

FIG. 4 shows the current drawn from the source (Ivcc) as VPWR is swept from 9v to 0v. VCC=5v for this sweep. The graph shows that VPWR must only be greater than 8.7v to limit leakage current into the pin to 1 nA. Minimum allowed VPWR input voltage in heater chip specifications is 9.9v. This means the leakage current into the temperature sense pin will not exceed 1 nA. Thus, the CMOS-controlled printhead sense circuit 10 will not load the external sense circuit 32 or any of the internal temperature sense circuitry 34 when placed in "transparent" mode.

The other shortcoming of the prior art design is the lack of definitive control of the circuit's operational state. On/Off state in the p-diode design is controlled by the LPWR rail. The steadiness of the logic power rail is dependent upon many factors including the capability of the internal regulator circuitry and the ground references in the system. As previously discussed, if this rail moves by a few tenths of a volt the leakage on the logic pin can rapidly exceed the noise threshold of the logic circuitry. The CMOS-controlled printhead sense circuit 10 uses VPWR to control circuit operation. This rail is fed directly from the printer and is relatively steady compared to the LPWR node. Thus, the CMOS-controlled printhead sense circuit 10 has a much more definitive operations control than the prior art p-diode circuit.

In summary, the CMOS-controlled printhead sense circuit 10 makes the following improvements over the prior art p-diode design: first, reduced leakage at the temperature sense output pin; and, second, definitive printhead sense circuit control.

The foregoing description of several embodiments of the invention has been presented for purposes of illustration. It is not intended to be exhaustive or to limit the invention to the precise forms disclosed, and obviously many modifications and variations are possible in light of the above teaching. It is intended that the scope of the invention be defined by the claims appended hereto.

What is claimed is:

1. A CMOS-controlled printhead sense circuit, comprising:

a CMOS control circuit module operable as a transmission gate transformable between first and second signal levels, the control circuit module having a first number of PMOS FETs equal to a second number of NMOS FETs wherein each of the PMOS FETs are serially arranged with one another as entirely enhancement mode transistors and each of the NMOS FETs are serially arranged with another including enhancement mode transistors and a gate-controlled transistor, the PMOS FETs and the NMOS FETs also being entirely arranged in series with a voltage control output residing between the PMOS FETs and the NMOS FETs; and a CMOS sense circuit module operable in a sense mode in response to said control circuit module being transformed to said first signal level and in a transparent mode in response to said control circuit module being transformed to said second signal level, the sense circuit module having a third number of PMOS FET equal to a fourth number of NMOS FET wherein the NMOS FET of the sense circuit module act only as a load on the PMOS FET of the sense circuit module and the PMOS FET of the sense circuit module is a transistor gate-controlled by the voltage control output from the control circuit module.

2. The circuit of claim 1 wherein an input to said gate-controlled transistor of the control circuit module is an output of the PMOS FET of the sense circuit module.

3. The circuit of claim 1 wherein the first number of PMOS FETs of the control circuit module and the second number of NMOS FETs of the control circuit module are equal to three.

4. The circuit of claim 1 wherein the third number of PMOS FET of the sense circuit module and the fourth number of NMOS FET of the sense circuit module are equal to one.

5. The circuit of claim 1 wherein one of the second number of NMOS FETs of the control circuit module and the fourth number of NMOS FET of the sense circuit module tie commonly to ground.

* * * * *